United States Patent [19]

Raudabaugh

[11] Patent Number: 5,138,517
[45] Date of Patent: * Aug. 11, 1992

[54] POLYMER HOUSED ELECTRICAL ASSEMBLIES USING MODULAR CONSTRUCTION

[75] Inventor: Donald E. Raudabaugh, Wadsworth, Ohio

[73] Assignee: Hubbell Incorporated, Orange, Conn.

[*] Notice: The portion of the term of this patent subsequent to Apr. 7, 2004 has been disclaimed.

[21] Appl. No.: 653,973

[22] Filed: Feb. 11, 1991

Related U.S. Application Data

[63] Continuation of Ser. No. 545,121, Jun. 28, 1990, abandoned, which is a continuation of Ser. No. 282,988, Dec. 2, 1988, abandoned, which is a continuation of Ser. No. 33,765, Apr. 3, 1987, abandoned, which is a continuation-in-part of Ser. No. 681,800, Dec. 14, 1984, Pat. No. 4,656,555.

[51] Int. Cl.$^5$ .............................................. H02H 9/04
[52] U.S. Cl. ................................. 361/117; 361/119; 361/127
[58] Field of Search .................... 361/117, 127, 119

[56] References Cited

U.S. PATENT DOCUMENTS

| | | | |
|---|---|---|---|
| T102,103 | 8/1982 | Lenk | 361/118 |
| 2,050,334 | 8/1936 | Kellogg . | |
| 2,586,285 | 2/1952 | Ackermann . | |
| 2,587,587 | 3/1952 | Bellezza et al. | 174/140 |
| 2,593,955 | 4/1952 | Ackermann . | |
| 2,802,175 | 8/1957 | Eldridge . | |
| 2,866,135 | 12/1958 | Cunningham | 361/128 |
| 2,947,903 | 8/1960 | Westrom | 361/126 |
| 2,997,529 | 8/1961 | Fink | 174/138 |
| 3,018,406 | 1/1962 | Innis | 361/128 |
| 3,260,796 | 7/1966 | Hirtzer | 174/178 |
| 3,261,910 | 7/1966 | Jacquier | 174/178 |
| 3,283,196 | 11/1966 | Parker et al. | 361/135 |
| 3,302,154 | 1/1967 | Bauer | 338/114 |
| 3,328,631 | 6/1967 | Greber | 315/36 |
| 3,412,273 | 11/1968 | Kennon et al. | 361/127 |
| 3,524,107 | 8/1970 | Reitz | 361/127 |
| 3,566,183 | 2/1971 | Olsen et al. | 315/36 |
| 3,567,541 | 3/1971 | Kaczerginski | 156/172 |
| 3,581,154 | 5/1971 | Willox . | |
| 3,586,934 | 6/1971 | Nakata | 361/329 |
| 3,631,323 | 12/1971 | Pittman | 361/118 |

(List continued on next page.)

FOREIGN PATENT DOCUMENTS

| | | | |
|---|---|---|---|
| 44650 | 1/1974 | Australia . | |
| 683681 | 4/1964 | Canada . | |
| 0008181 | 2/1980 | European Pat. Off. . | |
| 898603 | 10/1953 | Fed. Rep. of Germany | 361/126 |
| 29599 | of 1925 | France | 174/150 |
| 282485 | 12/1974 | U.S.S.R. . | |
| 730710 | 5/1955 | United Kingdom . | |
| 1109151 | 4/1968 | United Kingdom . | |
| 1505875 | 3/1978 | United Kingdom . | |
| 2188199 | 9/1987 | United Kingdom . | |

*Primary Examiner*—Todd E. DeBoer
*Attorney, Agent, or Firm*—Jerry M. Presson; Alfred N. Goodman

[57] ABSTRACT

An electrical device comprising a plurality of electrical assemblies formed as interchangeable modules, aligned in an end-to-end serial array and enclosed in a polymeric weathershed housing, the electrical assemblies being electrically and mechanically coupled together. Each electrical assembly in turn comprises a plurality of electrical components aligned in a row and in electrical connection with one another via their axially-directed ends and under an axially-directed compressive force via a nonconductive filament winding. The electrical components can be varistors, resistors, capacitors, and insulators or any combination thereof. In the case of varistors used to form a surge arrester, for example, voltage ratings can be enlarged merely by serially coupling a plurality of separately wrapped electrical components in the form of MOV blocks. Enclosing the electrical assemblies is a weathershed housing, which tightly receives the assemblies therein and which facilitates construction and allows the practice of good dielectric design.

57 Claims, 3 Drawing Sheets

U.S. PATENT DOCUMENTS

| | | | |
|---|---|---|---|
| 3,706,009 | 12/1972 | Reitz | 361/127 |
| 3,725,745 | 4/1973 | Zisa | 317/104 |
| 3,735,019 | 5/1973 | Hess et al. | 174/31 R |
| 3,835,439 | 9/1974 | Yonkers | 339/19 |
| 3,850,722 | 11/1974 | Kreft | 156/172 |
| 3,869,650 | 4/1975 | Cunningham et al. | 361/128 |
| 3,898,372 | 8/1975 | Kalb | 174/179 |
| 3,973,172 | 8/1976 | Yost | 317/61 |
| 3,987,343 | 10/1976 | Cunningham et al. | 317/61.5 |
| 4,029,380 | 6/1977 | Yonkers | 339/60 R |
| 4,092,694 | 5/1978 | Stetson | 361/126 |
| 4,100,588 | 7/1978 | Kresge | 361/127 |
| 4,107,567 | 8/1978 | Cunningham et al. | 313/325 |
| 4,161,012 | 7/1979 | Cunningham | 361/128 |
| 4,218,721 | 8/1980 | Stetson | 361/117 |
| 4,298,900 | 11/1981 | Avdeenko et al. | 361/127 |
| 4,326,232 | 4/1982 | Nishiwaki et al. | 361/127 |
| 4,404,614 | 9/1983 | Koch et al. | 361/126 |
| 4,456,942 | 6/1984 | Bronikowski | 361/127 |
| 4,463,405 | 7/1984 | Koch et al. | 313/231 |
| 4,467,387 | 8/1984 | Bergh et al. | 361/132 |
| 4,491,687 | 11/1985 | Kaczerginski et al. | 174/178 |
| 4,656,555 | 4/1987 | Raudabaugh | 361/117 |
| 4,812,944 | 3/1989 | Eberhard et al. | 361/127 |

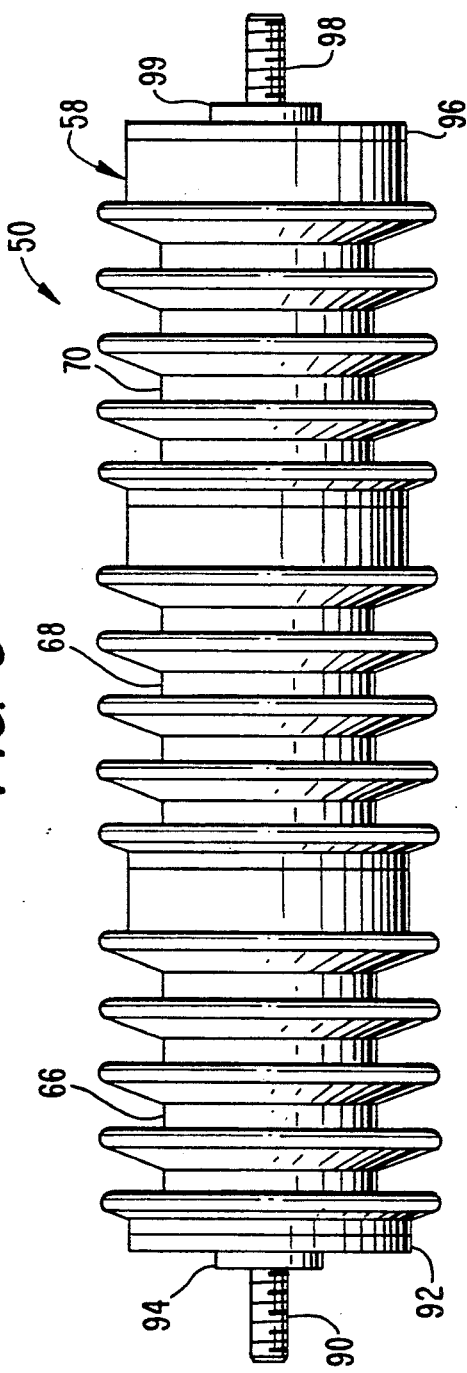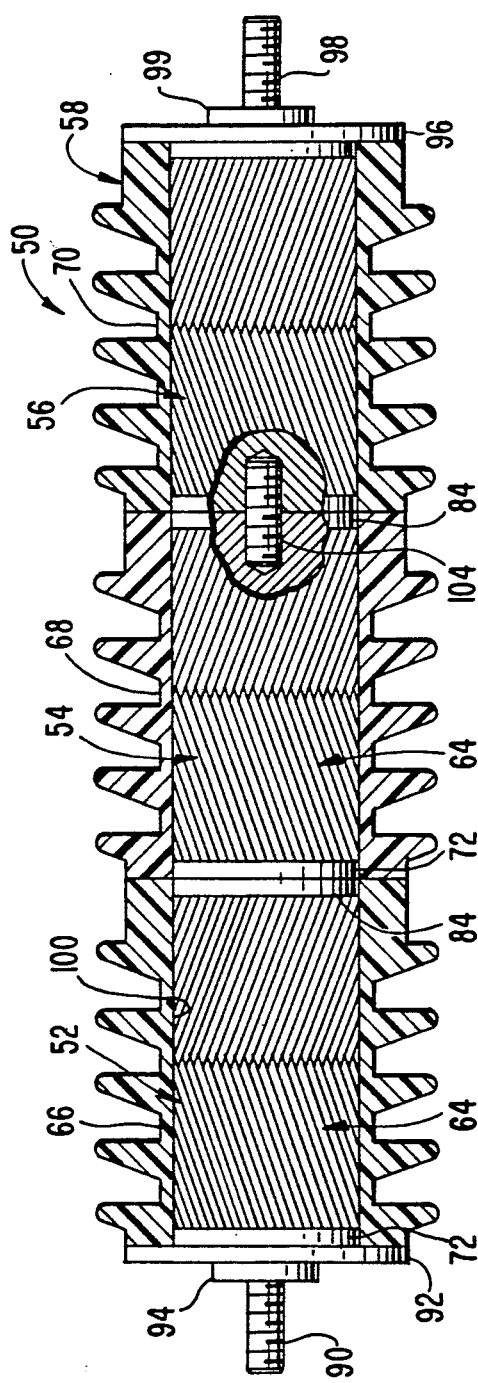

POLYMER HOUSED ELECTRICAL ASSEMBLIES USING MODULAR CONSTRUCTION

This application is a continuation of application Ser. No. 07/545,121 filed Jun. 28, 1990, now abandoned, which is a continuation of application Ser. No. 07/282,988 filed Dec. 2, 1988, now abandoned, which is a continuation of application Ser. No. 07/033,765 filed Apr. 3, 1987, now abandoned, which is a continuation-in-part of application Ser. No. 06/681,800 filed Dec. 14, 1984, now U.S. Pat. No. 4,656,555.

FIELD OF THE INVENTION

The invention relates to polymer housed electrical assemblies which are formed as modules and which are selectively coupled together to vary the overall electrical rating of the device. Each electrical assembly is formed from electrical components that are wrapped in a nonconductive filament winding. The components can be varistors, resistors, capacitors, insulators, or any combination thereof.

BACKGROUND OF THE INVENTION

A surge protector or arrester is commonly connected across a comparatively expensive piece of electrical equipment to shunt over-current surges. Such over-current surges occur, for example, when lightning strikes. When this happens, the surge arrester shunts the surge to ground, thereby protecting the piece of electrical equipment and the circuit from damage or destruction.

Present day surge arresters (commonly include an elongated, hollow cylindrical housing made of porcelain or the like, and a plurality of non-linear resistive blocks within the housing. Some of these structures also include spark gaps, the blocks and gaps being electrically interconnected to handle voltage and current surge conditions arising on a power line. The blocks commonly contain silicone carbide (SIC) or metal oxide varistors (MOV), and are usually in the shape of relatively short cylinders stacked within the arrester housing. The number of blocks employed is a function of the material (SIC or MOV) and the voltage and current ratings of the assembly.

For a surge arrester to function properly, intimate contact must be maintained between the MOV or SIC blocks. This necessitates placing an axial load on the blocks within the housing. Prior art arresters utilize bulky contact springs within the housing to provide this axial load. Typically, these springs can provide only relatively small loads, for example, about sixty pounds. As a result, prior art surge arresters experience one or more problems such as poor heat transfer between the MOV or SIC blocks and arrester terminals; non-uniform current distribution; and high contact resistances at joints. Furthermore, units having low contact force sputter and the ionized metal which is produced can cause axial flashover at high currents.

An additional problem with surge arresters of the prior art is that they, on rare occasions, fail in a dangerous fashion. When these arresters fail and experience high fault currents, the bursting unit may throw parts and cause property damage.

In addition, some of the prior art devices are difficult to assemble, have poor dielectric design, are susceptible to water invasion, and require totally different devices to provide varied voltage ratings.

Examples of prior art surge arresters are disclosed in the following U.S. Pat. Nos. 2,587,587 to Bellezza et al; 2,947,903 to Westrom; 2,997,529 to Fink; 3,018,406 to Innis; 3,261,910 to Jacquier; 3,412,273 to Kennon et al; 3,524,107 to Reitz; 3,566,183 to Olsen; 3,567,541 to Kaczerglnski; 3,586,934 to Nakata; 3,706,009 to Reitz; 3,725,745 to Zisa; 3,850,722 to Kreft; 3,973,172 to Yost; 3,987,343 to Cunningham et al; 4,029,380 to Yonkers; 4,092,694 to Stetson; 4,100,588 to Kresge; 4,107,567 to Cunningham et al; 4,161,012 to Cunningham; 4,218,721 to Stetson; 4,404,614 to Koch et al; 4,467,387 to Bergh et al; 4,491,687 to Kaczerginski et al; and U.S. Defensive Publication T102,103, as well as U.K. patents 730,710; 1,109,151; and 1,505,875.

SUMMARY OF THE INVENTION

Accordingly, it is an object of this invention to provide electrical devices, particularly surge arresters, which are relatively simple to assemble, have good dielectric design, resist water invasion, and have modular components and housings to simply vary voltage ratings.

It is also an object of this invention to provide electrical assemblies, such as surge arresters, having high axial loadings, thereby resulting in uniform current distribution, low contact resistances at joints, and excellent heat transfer to the arrester terminals.

Another object of this invention is to provide an electrical assembly, such as a surge arrester, having a shatter-proof housing which has a high-impact strength and which does not fail in a dangerous fashion.

Another object of this invention is to provide a MOV block assembly with greatly improved tensile and cantilever strengths.

Yet another object of this invention is to provide a surge arrester which is forgiving of dimensional variations in associated parts, thereby reducing the need for expensive close tolerances.

The foregoing objects are basically attained by providing an electrical device, the combination comprising a plurality of electrical assemblies, each having first and second ends and substantially cylindrical outer surfaces with substantially similar diameters, the assemblies being oriented in an end-to-end serial array; a connector, coupled to each pair of adjacent electrical assemblies, for electrically and mechanically coupling each adjacent pair of electrical assemblies; a weathershed housing, enclosing the assemblies, for protecting the assemblies, the weathershed housing having a substantially cylindrical throughbore with substantially the same diameter as the diameters of each of the electrical assemblies' outer surfaces; and terminals, coupled to each of the two electrical assemblies at opposite ends of the serial array.

Other objects, advantages and salient features of the invention will become apparent from the following detailed description, which, taken in conjunction with the annexed drawings, discloses preferred embodiments of the invention.

DRAWINGS

Referring to the drawings which form a part of this original disclosure:

FIG. 5 is a side elevational view of an electrical device in accordance with the invention including a plurality of modular and interchangeable filament wrapped electrical assemblies enclosed in a weathershed housing;

FIG. 6 is a side elevational view in partial longitudinal section of the device shown in FIG. 5 showing the electrical assemblies including the filament windings inside the weathershed housing;

DETAILED DESCRIPTION OF THE INVENTION

Figure 1:
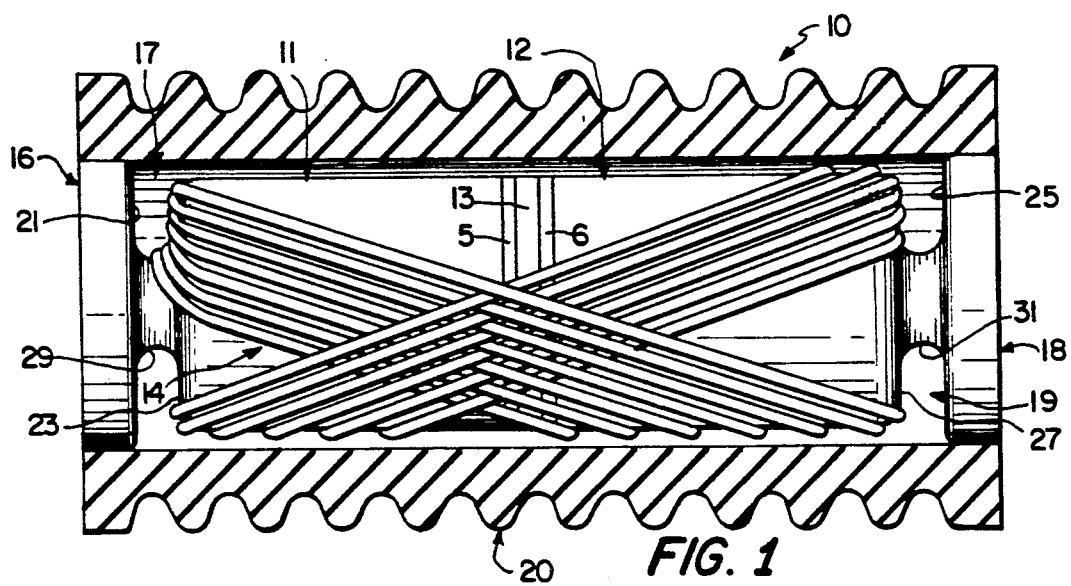
FIG. 1 is a side elevational view, in longitudinal section, showing a surge arrester constructed in accordance with the principles of this invention.
Figure 2:
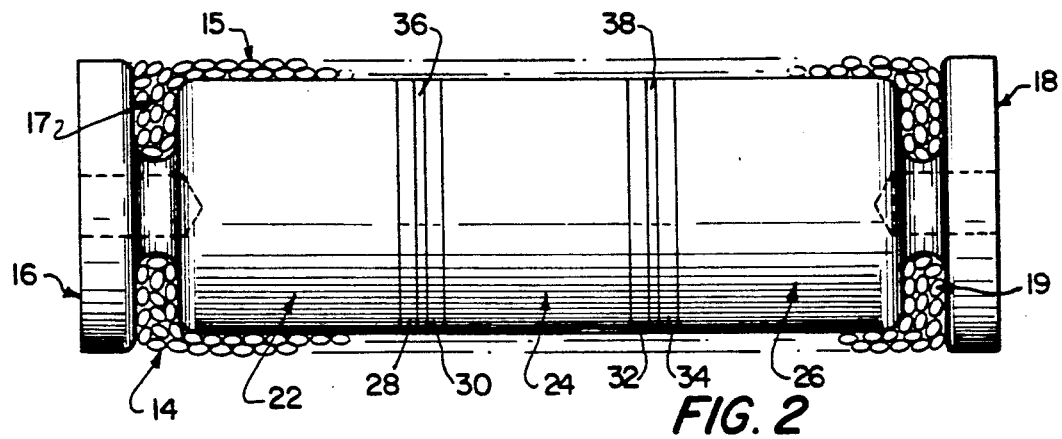
FIG. 2 is a side elevational view, in section, of a modified filament wrapped assembly comprising a plurality of MOV blocks, spring washers, and spacers which are filament wrapped in several layers in accordance with the principles of this invention.
Figure 3:
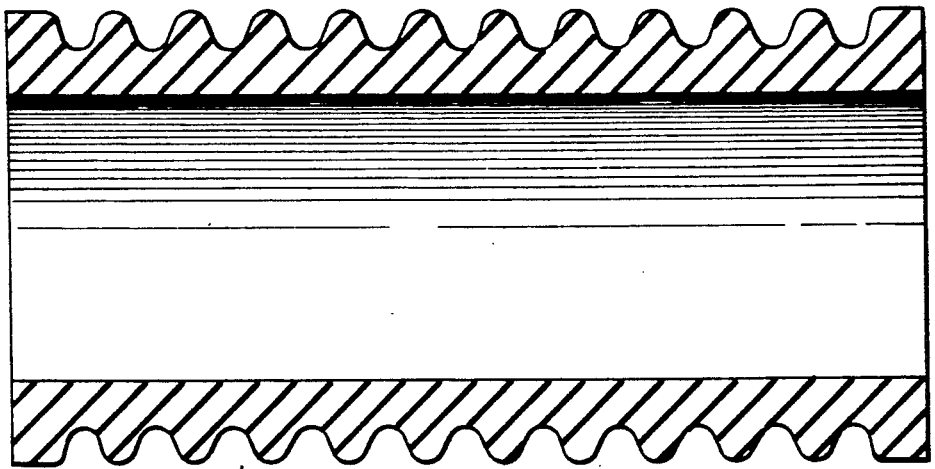
FIG. 3 is a side elevational view of a pre-cured polymeric weathershed housing which is designed to receive the filament wrapped MOV blocks.

As seen in FIGS. 1, 2, and 3, the invention may take the form of a surge arrester 10 comprising a filament wound core of MOV blocks 11 and 12, first and second terminal pieces 16 and 18, filament windings 14, and a polymeric weathershed housing 20. The blocks 11 and 12 are separated by a spring washer 13, and load and current distributing washers 5 and 6.

As seen in FIG. 2, a modified filament wound electrical assembly 15 may comprise three MOV blocks 22, 24 and 26, conducting spacers 28, 30, 32 and 34, spring washers 36 and 38, filament windings 14, and first and second terminal pieces 16 and 18, having first and second circumferential grooves 17 and 19. Windings 14 provide a plurality of layers over the MOV blocks.

FIG. 3 shows the pre-cured polymeric weathershed housing 20, which is designed to receive the filament wrapped assembly 15 shown in FIG. 2 as well as that shown in FIG. 1.

The MOV blocks furnish a predetermined non-linear electrical characteristic between the ends thereof in a well known fashion. The blocks themselves are usually in the shape of relatively short cylinders and may be stacked within the housing in a row either in intimate contact with each other, or separated by one or more spring washers 36 and 38 and/or spacers 28, 30 and 32 as illustrated in FIG. 2. A preferred construction, which is shown in FIG. 1, comprises placing a spring washer 13 and load and current distributing washers 5 and 6 between the two MOV blocks 11 and 12, which are adjacent to, and in intimate contact with the terminal pieces 16 and 18. This provides an excellent thermal path to ambient and improves operating characteristics when thermal stability is a factor.

The filament windings 14 may be comprised of any suitable continuous fiber such as nylon, rayon, glass and polyethylene. Other fibers such as ceramic fibers may also be used. A glass filament winding is preferred.

Figure 4:
FIG. 4 is an enlarged transverse cross-sectional view of a filament winding which may be used in accordance with this invention and comprises a plurality of strands.

The filament windings 14 may be in the form of a single fiber, or each winding may be comprised of many smaller strands 15 as depicted in FIG. 4.

The filament windings may optionally carry a resinous material. The resin may be either natural or synthetic, and may be in the partially cured or uncured state. While epoxy resins are preferred, any other suitable resin may be used.

The polymeric weathershed housing 20 generally may be of any shape and size which will achieve the desired effects of providing a shatterproof enclosure having high impact strength and good weather resistance. The weathershed housing may be comprised of a rigid or elastomeric polymer, and may be either synthetic, natural, or a combination thereof. Examples of such polymers are natural and synthetic rubbers, synthetic thermoplastic elastomers, such as nylon, polyvinylchloride, and polyethylene (linear), and thermosetting elastomers such as polyethylene (cross-linked), and polyesters. The preferred weathershed elastomer is ethylene-propylene rubber (EPM).

The terminal pieces 16 and 18 may be comprised of any conductive material, preferably a highly conductive metal, and should preferably contain circumferential annular grooves to aid in the process of winding the filament.

In FIGS. 1 and 2, the circumferential grooves or recesses 17 and 19 are shown as having vertical sidewalls 21, 23, 25 and 27, i.e., sidewalls whose surfaces are perpendicular to the longitudinal central axis of the aligned components and form shoulders that radially extend. These sidewalls are joined by annular curved bottom walls 29 and 31. In practice, these grooves may be of any configuration which will serve the purpose of retaining the windings or they may be merely substantially radially extending shoulders.

The spring washers and spacers themselves are conventional and need not be described in detail.

While the discussion has centered on the use of MOV blocks, it should be understood that the invention contemplates and FIGS. 1 and 2 also depict the use of other electrical components such as resistors, capacitors, and insulators in place of, or in addition to, MOV blocks. Such arrangements will be useful for other types of electrical assemblies.

It should also be noted that while the drawings illustrate components having a right circular cylindrical configuration, "cylindrical", as defined for the purposes of this invention is broadly defined as the surface traced by a straight line moving parallel to a fixed straight line and intersecting a fixed curve. A curve is the intersection of two geometrical surfaces. Also, the term "axial", for the purposes of this invention, refers to the longitudinal central axis of the structure. Thus, while cylindrical blocks are preferred, blocks having a polygonal cross section may be used.

The method for making the surge arrester of this invention comprises a first step of aligning a plurality of MOV blocks, with or without interposed spacers and/or spring washers, under an axial load. This invention contemplates the use of any axial load from about 20 pounds per square inch of block cross section up to just less than the crushing strength of the blocks employed. The preferred range is from about 50 pounds per square inch to 500 pounds per square inch of block cross section.

Any known manner for placing the aligned MOV blocks under an axial load would be acceptable provided it facilitates the wrapping process. One acceptable method is to align the blocks in a lathe-type apparatus capable of providing an axial load.

Once the plurality of MOV blocks, with or without spacers and spring washers, is aligned and placed under an axial load, it is ready to be filament wrapped. Any suitable method for filament wrapping the aligned components is acceptable provided that it will retain the aligned components under the specified axial load. The preferred method for wrapping the aligned components comprises a helical and overlapping wrapping at a relatively low helical angle and is as follows. First, the filament winding is secured over the shoulder of one terminal piece. Then the components are rotated approximately 180°, while the filament is drawn axially along the surface of the assembled components. Upon reaching the opposite terminal piece, the filament is wound over the other shoulder for approximately another 180°. The winding machine then sends the filament back to the starting terminal while the components rotate another 180°. Again, the filament makes a half turn in the terminal groove and this cycle is repeated as many times as is desired. The degree of rotation and the axial traverse are slightly out of synchronism so that subsequent cycles will advance the windings around the surface of the components. Multiple cycles will ultimately cover the entire surface with the filament. A partially covered assembly using this winding pattern is illustrated in FIG. 1. Additional layers of winding may be added for additional strength as shown in FIG. 2.

In practice, if the degree of rotation and the axial traverse are approximately sever degrees out of synchronism, twenty-five cycles will approximately cover the entire surface, and 100 cycles will provide four layers of winding for additional strength.

It should be understood that this process does rot require axial rotations of 180°. Rather, any axial rotation is acceptable provided that a wrap results which will retain the components under an axial load. In other words, union reaching a terminal end, the filament could be wrapped around the shoulder for more or less than 180°. Also, &.he filament may be drawn axially along the aligned components with lesser or greater rotational movement between &he components and the filament.

Also, if a notched shoulder is used, no relative rotation need be used thereby allowing for pure axial lay of the filament without slippage at the shoulder.

As previously mentioned, the filament winding may carry a resinous compound. The resinous compound may be applied to the filament winding by any number of means such as pre-coating the filament in a resinous bath, or applying the resinous compound to the filaments after the components have been wrapped. Additionally, the resinous compound may be either in the semi-cured or uncured state. If the resinous compound is in the uncured state, curing will take place at a later time, preferably during application of the polymeric weathershed housing.

Once the components have teen wrapped, the weathershed housing may be applied. As previously mentioned, the housing preferably comprises a polymeric compound. This application can be done in numerous ways, such as by inserting the filament wrapped assembly into a pre-cured elastomeric polymer weathershed. If the filament winding carries an uncured resinous compound, the windings may be adhesively bonded to the pre-cured weathershed in an oven to create a finished arrester. Other methods such as molding, spraying, or dipping may be used to provide a polymeric weathershed onto the filament wound components. Virtually any method which achieves the desired result is acceptable.

When a precured elastomeric weathershed is used, the housing is straight walled inside as shown in FIG. 3. This facilitates assembly. In practice, the outer end diameter of the terminal pieces is made equal to the diameter of the wound assembly. The diameter of the shoulder is less by the thickness of glass over the shoulder. After the body of the assembly is wound, any remaining groove is filled with resin-wetted glass wound circumferentially at both ends. The finished assembly should, to the extent possible, approximate a smooth cylinder as shown in FIG. 2.

Again, while the invention has been illustrated in terms of a surge arrester, the process for providing filament windings can be applied to any suitable electrical assembly comprising elements such as resistors, capacitors, and insulators instead of, or in addition to, MOV parts.

If other components are added to or substituted in the assembly, a similarly shaped electrical assembly should result. The length to radius ratio may be different than that normally associated with surge arresters, however, the concept of providing a filament wrapped electrical assembly will remain.

EMBODIMENT OF FIGS. 5-8

Figure 7:
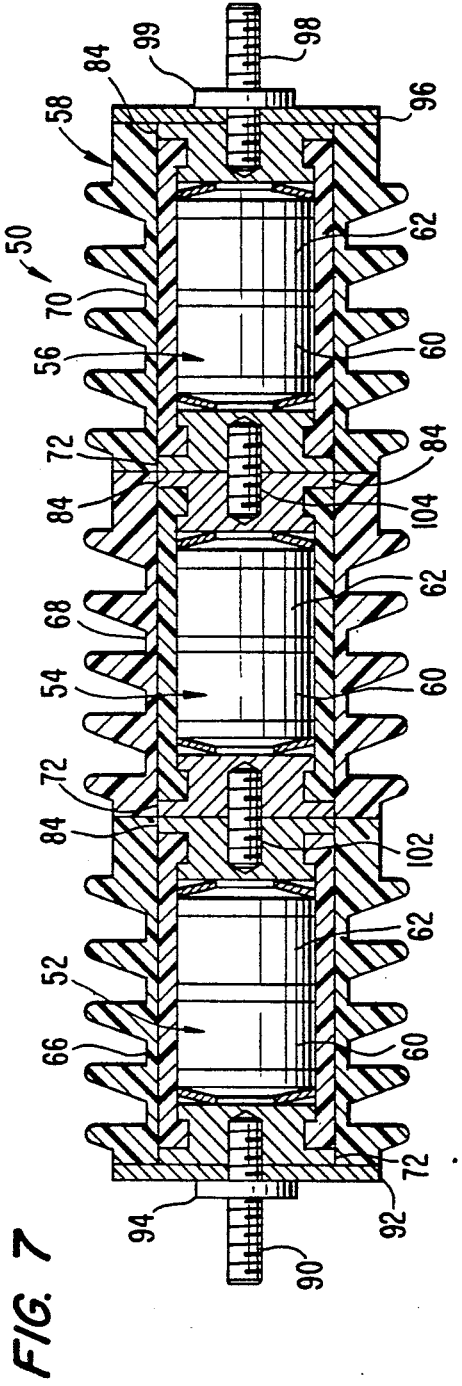
FIG. 7 is a side elevational view in longitudinal section of the device shown in FIG. 5 and is similar to FIG. 6 but shows the inside of the electrical assemblies.

Referring to FIGS. 5-8, an electrical device 50 in accordance with the invention is shown formed of a plurality of modular electrical assemblies 52, 54 and 56 enclosed in a polymeric, elastomeric weathershed housing 58. Each of the electrical assemblies is similar to those disclosed above regarding FIGS. 1-4, is advantageously substantially identical to and interchangeable with the outer electrical assemblies, and is in turn formed from a plurality of cylindrical electrical components 60 and 62. These components are aligned in a row, and are in electrical connection with one another via their axially-directed ends and under an axially-directed compressive force via a nonconductive filament winding 64, as disclosed above regarding FIGS. 1-4. The electrical components can be varistors, resistors, capacitors, insulators, or any combination thereof. While only two electrical components are shown in FIGS. 5-7, more than two can be used.

In the case of varistors used to form a surge arrester, voltage ratings can be enlarged merely by serially and selectively coupling the plurality of modular electrical assemblies together mechanically and electrically.

The weathershed housing 58 can be one section of polymeric material or a plurality of sections 66, 68 and 70 in an end-to-end aligned serial array as seen in FIGS. 5-8. These sections receive the electrical assemblies therein via a slight interference fit and therefore facilitate construction and allow the practice of good dielectric design by reducing radial gaps.

Figure 8:
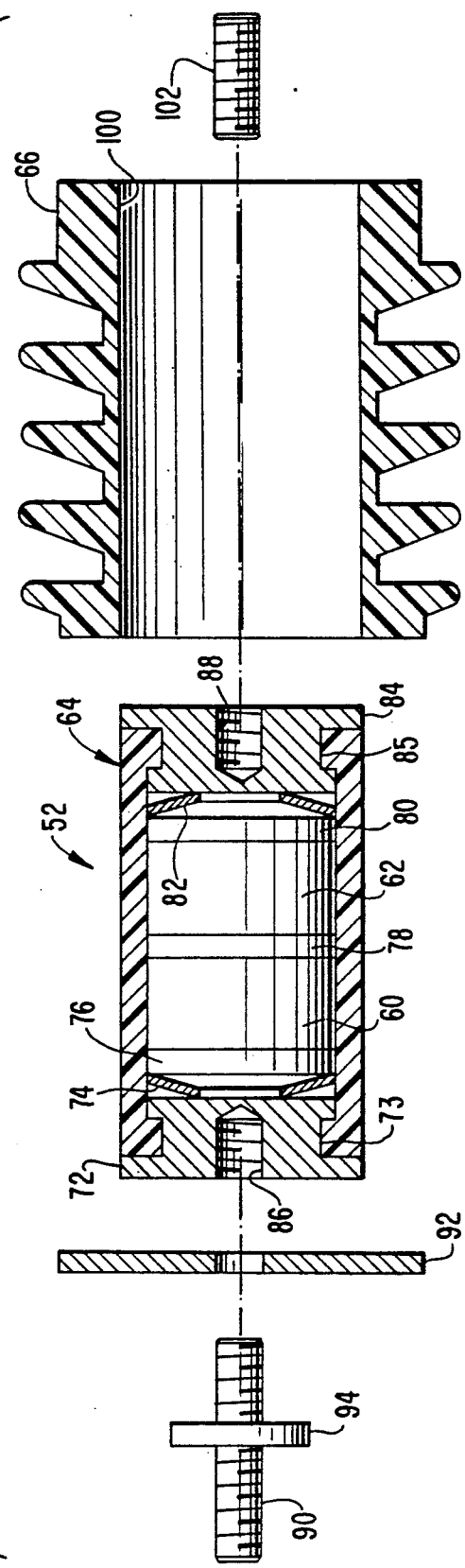
FIG. 8 is an enlarged and exploded side elevational view in longitudinal section of one of the electrical assemblies shown in FIGS. 6 and 7.

Each of the electrical assemblies 52, 54 and 16 are substantially the same, so only assembly 52 seen in FIGS. 6-8 will be described in detail. Assembly 52 has a substantially cylindrical overall outer surface and comprises first end member, or terminal 72, spring washer 74, contact disc 76, electrical component 60, contact disc 78, electrical component 62, contact disc 80, spring washer 82, and second end member, or terminal 84. The nonconductive filament winding 64 is coupled to end members 72 and 84 via reception in peripheral grooves 73 and 85 respectively therein, encloses the electrical components, and maintains them under an axially-directed force, which is augmented by the spring washers. All of the parts comprising electrical assembly 52 are conductive except the winding, unless the components are insulators. Advantageously, end members 72 and 84 are formed from aluminum. The exposed outer surfaces of the filament winding 64 and the end members 72 and 84 are all substantially cylindrical and have substantially equal diameters.

End members 72 and 84 form internal terminals, have cylindrical exposed outer surfaces, and have opposite, first and second axially-directed planar ends with internally threaded sockets 86 and 88 formed respectively therein. Socket 86 threadedly receives threaded end stud 90 which can be connected to an electrical power source and is in the form of a metallic, conductive shoulder bolt. End plate 92 is received on end stud 90, tightly engages an end of the weathershed housing as seen in FIGS. 5-8, and is held in place via rigid shoulder 94 on the stud. A second end plate 96 is similarly positioned at the other end of the housing and is received on end stud 98 which is connected to ground and maintained thereon via shoulder 99 on the stud. Studs 90 and 98 in essence form external terminals for the overall device 50. Each weathershed housing as seen in FIGS. 5-7 has a plurality of weathersheds thereon with substantially the same outer diameter and root diameter, each of the end plates 92 and 96 having an outer diameter greater than the root diameter but less than the outer diameter of the weathersheds.

Weathershed housing section 66 has a through passageway in the form of a throughbore with an inwardly facing cylindrical surface 100 which tightly receives therein the outer cylindrical surface of the electrical assembly 52. The same is true regarding sections 68 and 70 and assemblies 54 and 56. The reception of the assemblies in the throughbore is preferably via an interference fit with the assemblies having outer surface diameters that are substantially equal to one another and from about 2% to about 9% greater than the throughbore diameter, which is substantially constant along its length. This reduces radial gaps and thus provides advantageous dielectric design.

To mechanically and electrically connect the three electrical assemblies 52, 54 and 56 together in an aligned, straight end-to-end serial array, a pair of externally threaded, metallic, and conductive studs 102 and 104 are used, as seen in FIGS. 6 and 7. These studs are advantageously substantially identical and interchangeable, as well as substantially rigid and formed of stainless steel. Stud 102 couples the adjacent ends of adjacent assemblies 52 and 54 by being threadedly received in the threaded sockets in each assembly's adjacent end member, and the same is true regarding stud 104 and adjacent assemblies 54 and 56. The adjacent ends of adjacent assemblies are screwed tightly together on the studs to provide a substantially gap-free engagement between the facing planar axially-directed outer ends of the end members thereon. This provides an advantageous electrical and mechanical interface by reducing possible separation during bending of the device. If more assemblies are used, additional studs are added to connect them, with the addition of any necessary weathershed housing sections, or use of a larger, one-piece housing. As seen in FIG. 8, stud 102 is receivable in socket 88.

To provide sealing against water invasion, preferably a neoprene gasket is interposed between each adjacent stud shoulder and end plate, and silicone grease is interposed between each adjacent end plate and end member, between adjacent end members, and between the outer surfaces of the electrical assemblies and the inwardly facing surfaces of the throughbore in each weathershed housing section. Use of grease between the weathershed housing section and the electrical assembly aids in construction and assembly by reducing friction and also reduces any radial gaps therebetween.

Advantageously as seen in FIGS. 5-8, the longitudinal axes of the studs 90, 102, 104, and 98; the electrical components in each assembly 52, 54 and 56; and the weathershed housing 58 are coaxially aligned. Preferably, the planar ends of the end members are perpendicular to these aligned longitudinal axes.

Preferably, with regard to the electrical device 50 shown in FIGS. 5-8, the axial load on the electrical components before winding is about 750 pounds per square inch, and the filament is wet epoxy coated fiberglass which is wound through about 100 turns and is cured for about two hours at 150° C.

While various embodiments have been chosen to illustrate the invention, it will be understood by those skilled in the art that various changes and modifications can be made therein without departing from the scope of the invention as defined in the appended claims.

What is claimed is:

1. An electrical device, the combination comprising:
    a plurality of conductive electrical assemblies, each electrical assembly having first and second ends and substantially cylindrical lateral outer surfaces with substantially similar diameters, said assemblies being oriented in an end-to-end serial array;
    means, coupled to each pair of adjacent electrical assemblies, for electrically and mechanically coupling each adjacent pair of electrical assemblies, said mechanical coupling resisting relative axial movement between said electrical assemblies;
    weathershed means, completely enclosing the lateral outer surfaces of said assemblies and said means for electrically and mechanically coupling, for protecting said assemblies and said means for electrically and mechanically coupling,
    said weathershed means having a substantially cylindrical throughbore with substantially the same diameter as the diameters of each of said electrical assemblies' lateral outer surfaces; and
    terminal means, coupled to each of the two electrical assemblies at opposite ends of said serial array.

2. An electrical device according to claim 1, wherein said electrical assemblies each comprise a plurality of varistors.

3. An electrical device according to claim 1, wherein said means for electrically and mechanically coupling comprises a threaded connector.

4. An electrical device according to claim 3, wherein said threaded connector comprises a threaded stud.

5. An electrical device according to claim 1, wherein said means for electrically and mechanically coupling comprises
    a conductive, externally threaded stud,
    a first conductive end member having a first internally threaded socket receiving one end of said stud, and
    a second conductive end member having a second internally threaded socket receiving the second end of said stud.

6. An electrical device according to claim 1, wherein said weathershed means comprises a plurality of weathershed housings in an end-to-end, continuous serial array.

7. An electrical device according to claim 1, wherein said weathershed means comprises a pair of end plates tightly engaging the opposite ends of said throughbore.

8. An electrical device according to claim 1 wherein said weathershed means is formed from elastomeric material.

9. An electrical device according to claim 1, wherein said weathershed means is formed from polymeric material.

10. An electrical device according to claim 1, wherein
said cylindrical outer surfaces on said electrical assemblies have diameters which are from about 2% to about 9% greater than the diameter of said throughbore.

11. An electrical device according to claim 1, wherein
said electrical assemblies are received in said throughbore via an interference fit.

12. An electrical device according to claim 2 wherein said varistors are generally cylindrical metal oxide varistors.

13. An electrical device according to claim 5 wherein said end members are generally cylindrical.

14. An electrical device, the combination comprising:
a plurality of conductive electrical assemblies, each electrical assembly having first and second ends, said assemblies being oriented in an end-to-end serial array;
means, coupled to each pair of adjacent electrical assemblies, for electrically and mechanically coupling each adjacent pair of electrical assemblies, said mechanical coupling resisting relative axial movement between said electrical assemblies;
weathershed means, completely enclosing the lateral outer surfaces of said assemblies and said means for electrically and mechanically coupling, for protecting said assemblies and said means for electrically and mechanically coupling, and
terminal means, coupled to each of the two electrical assemblies at opposite ends of said serial array,
each of said electrical assemblies including
a plurality of conductive electrical components aligned in a row and having axially-directed ends, said electrical components being in electrical connection with one another via said axially-directed ends, and
means, wrapped around said components, for applying an axially-directed compressive force on said plurality of electrical components to maintain said electrical connection thereof,
said means for applying an axially-directed compressive force including a nonconductive filament winding.

15. An electrical device according to claim 14, wherein said means for electrically and mechanically coupling comprises
a conductive, externally threaded stud,
a first conductive end member having a first internally threaded socket receiving one end of said stud, and
a second conductive end member having a second internally threaded socket receiving the second end of said stud.

16. An electrical device according to claim 15 wherein said electrical components are generally cylindrical varistor blocks; and said end members are generally cylindrical, said varistor blocks and said end members having substantially equally transverse diameters.

17. An electrical device according to claim 14 wherein said electrical components are generally cylindrical metal oxide varistor blocks.

18. An electrical device according to claim 14, wherein said weathershed means comprises
a plurality of weathershed housings in an end-to-end serial array.

19. An electrical device according to claim 18, wherein
each of said electrical assemblies has a substantially cylindrical outer surface, and
each of said weathershed housings has a substantially cylindrical throughbore having substantially the same diameter as the outer diameter of each of said electrical assemblies' outer surfaces enclosed therein.

20. An electrical device according to claim 14, wherein said terminal means comprises
a first conductive, externally threaded end stud,
a first conductive end member having a first internally threaded socket receiving one end of said first end stud,
a second conductive, externally threaded end stud, and
a second conductive end member having a second internally threaded socket receiving one end of said second end stud.

21. An electrical device according to claim 20, wherein said terminal means further comprises
a first end plate coupled to said first end stud and engaging said weathershed means, and
a second end plate coupled to said second end stud and engaging said weathershed means.

22. An electrical device according to claim 14, wherein
said end-to-end serial array is substantially straight.

23. An electrical device according to claim 14, wherein
said means for applying an axially-directed compressive force includes at least one spring washer.

24. An electrical device according to claim 14, wherein
said plurality of conductive electrical components comprise at least one contact disc and at least one varistor.

25. An electrical device according to claim 14, wherein
said plurality of conductive electrical components comprise at least one resistor.

26. An electrical device according to claim 14, wherein
said plurality of conductive electrical components comprise at least one capacitor.

27. An electrical device according to claim 14, wherein
said weathershed means is formed of polymeric material.

28. An electrical device according to claim 14, wherein
each of said electrical assemblies has a substantially cylindrical outer surface, and
said weathershed means has a substantially cylindrical throughbore having substantially the same diameter as the outer diameter of each of said electrical assemblies' outer surfaces enclosed therein.

29. An electrical device, the combination comprising:
a plurality of substantially identical and interchangeable modular conductive electrical assemblies in an end-to-end serial array, each electrical assembly having a substantially cylindrical lateral outer surface with substantially similar diameters,
each electrical assembly having first and second terminals at opposite ends thereof;
weathershed means, completely enclosing the lateral outer surfaces of said electrical assemblies, for protecting said electrical assemblies;
first means, coupled to adjacent terminals, for internally electrically and mechanically coupling adjacent electrical assemblies, said mechanical coupling resisting relative axial movement between said electrical assemblies; and
second means, coupled to the two terminals at opposite ends of said serial array, for establishing an external electrical and mechanical connection of the device,
said weathershed means also completely enclosing the lateral outer surface of said first means, for protecting said first means, and having a substantially cylindrical throughbore with substantially the same diameter as the diameters of each of said electrical assemblies' lateral outer surfaces.

30. An electrical device according to claim 29, wherein
said first means comprises a plurality of substantially identical and interchangeable threaded members.

31. An electrical device according to claim 29, wherein
said first means comprises a plurality of threaded members.

32. An electrical device according to claim 29, wherein
said second means comprises a pair of substantially identical and interchangeable threaded members.

33. An electrical device according to claim 29, wherein
said second means comprises a pair of threaded members.

34. An electrical device according to claim 29, wherein
each of said terminals has a substantially planar axially-directed outer end,
adjacent pairs of said terminals having their planar axially-directed outer ends in substantial engagement.

35. An electrical device according to claim 29, wherein
each electrical assembly includes a nonconductive filament winding interconnecting said first and second terminals, and a plurality of varistors.

36. A surge arrester, the combination comprising:
at least one non-linear resistive block having first and second axially-directed ends;
a first electrically conductive terminal having an axially directed end thereon in electrical connection with said first axially-directed end of said block, and an axially-directed surface thereon facing in a direction opposite the axially-directed end thereof.
a second electrically conductive terminal having an axially directed end thereon in electrical connection with said second axially-directed end of said block, and an axially-directed surface thereon facing in a direction opposite the axially-directed end thereof; and
a non-conductive filament wrapped around said block and wrapped around and engaging said axially-directed surfaces on said terminals, said filament being axially tensioned to thereby apply an axially-directed compression force to said terminals and said block to resist transverse bending of the arrester and to maintain said terminals and block in electrical connection.

37. A surge arrester according to claim 36, wherein said non-conductive filament engages said block.

38. A surge arrester according to claim 36 and further including
a resilient housing receiving said block, terminals, and nonconductive filament therein.

39. A surge arrester according to claim 36, wherein said axially-directed ends of said terminals are substantially planar.

40. A surge arrester according to claim 39, wherein said axially-directed ends of said block are substantially planar.

41. A surge arrester according to claim 36, wherein
said filament has a substantially cylindrical outer surface, and
said first and second terminals have substantially cylindrical outer surfaces of substantially equal diameter,
the diameters of said outer surfaces on said filament and said first and second terminals being substantially equal.

42. A surge arrester according to claim 36, wherein
said non-conductive filament engages said block,
said axially-directed ends of said terminals are substantially planar,
said axially-directed ends of said block are substantially planar,
said filament has a substantially cylindrical outer surface, and
said first and second terminals have substantially cylindrical outer surfaces of substantially equal diameter,
the diameters of said outer surfaces on said filament and said first and second terminals being substantially equal.

43. A surge arrester according to claim 42 and further including
a resilient housing receiving said block, terminals, and nonconductive filament therein.

44. A surge arrester according to claim 43, wherein
said resilient housing has a through passageway having an inwardly facing, substantially cylindrical surface having a diameter substantially equal to the diameters of said outer surfaces of said filament and said first and second terminals.

45. A surge arrester according to claim 43, wherein
said resilient housing has a through passageway having an inwardly facing, substantially cylindrical surface in an interference fit with said outer surfaces of said filament and said first and second terminals.

46. A surge arrester comprising:
first and second electrically conductive terminals;
at least one non-linear resisting block having first and second axially-directed ends, and positioned between said first and second terminals to form a substantially cylindrical structure having a substantially uniform circumferential outer surface;

said first terminal having an axially-directed end thereon in electrical connection with said first axially-directed end of said block, said first terminal including a first surface facing in a direction opposite the axially-directed end thereof;

said second terminal having an axially-directed end thereon in electrical connection with said second axially-directed end of said block, said second terminal including a second surface facing in a direction opposite the axially-directed end thereof;

a plurality of elongated tensile elements formed of an insulating material located circumferentially around said outer surface and engaging said first and second surfaces of said first and second terminals, said tensile elements being under axial tension to thereby apply an axially-directed compression force to said first and second terminals and said block, whereby transverse bending of the arrester is resisted and said first and second terminals and said block are maintained in electrical connection; and a housing having a through passageway with an inwardly facing substantially cylindrical surface having a diameter substantially equal to the diameter of said outer surface, and receiving said block, terminals and tensile elements therein.

47. A surge arrester according to claim 46, wherein said tensile elements are joined by adhesive.

48. A surge arrester according to claim 47, wherein at least certain ones of said tensile elements lie in substantially parallel relationship.

49. A surge arrester according to claim 48, wherein said certain ones of said tensile elements lie adjacent one another.

50. A surge arrester according to claim 49, wherein other ones of said tensile elements overlap said certain ones of said tensile elements.

51. A surge arrester according to claim 46, wherein said tensile elements lie in an overlapping relationship throughout the length of said cylindrical structure.

52. A surge arrester according to claim 46, wherein said at least one non-linear resistive block comprises a metal oxide varistor block.

53. A surge arrester comprising:

first and second electrically conductive terminals;

at least one non-linear resistive block, having first and second axially-directed ends and a substantially cylindrical outer surface, positioned between said first and second terminals;

a plurality of elongated tensile elements formed of an insulating material positioned around said block at circumferentially spaced location;

said first terminal having an axially-directed end thereon in electrical connection with said first axially-directed end of said block, said first terminal including a first surface for engaging said tensile elements;

said second terminal having an axially-directed end thereon in electrical connection with said second axially-directed end of said block, said second terminal including a second surface for engaging said tensile elements;

said tensile elements engaging said first and second surfaces and being axially tensioned to thereby apply an axially-directed compression force to said first and second surfaces and said block to resist transverse bending of the arrester and to maintain said first and second terminals and said block in electrical connection; and a housing having a through passageway with an inwardly facing substantially cylindrical surface having a diameter substantially equal to the diameter of said block outer surface, and receiving said block therein.

54. A surge arrester according to claim 53, wherein said at least one non-linear resistive block comprises a metal oxide varistor block.

55. A surge arrester according to claim 53, wherein said at least one non-linear resistive block comprises a plurality of non-linear resistive blocks.

56. A surge arrester according to claim 53, wherein at least certain ones of said tensile elements lie in substantially parallel relationship.

57. A surge arrester according to claim 53, wherein said tensile elements lie in an overlapping relationship.

* * * * *